(12) United States Patent
Bridges

(10) Patent No.: US 8,887,372 B2
(45) Date of Patent: Nov. 18, 2014

(54) INJECTION MECHANISM FOR MODULES, AND METHOD OF USING THE SAME

(75) Inventor: Rodney Bridges, Lilburn, GA (US)

(73) Assignee: ADVA Optical Networking SE, Meiningen OT Dreissigacker (DE)

( * ) Notice: Subject to any disclaimer, the term of this patent is extended or adjusted under 35 U.S.C. 154(b) by 238 days.

(21) Appl. No.: 13/486,671

(22) Filed: Jun. 1, 2012

(65) Prior Publication Data

US 2013/0318770 A1 Dec. 5, 2013

(51) Int. Cl.
*B23P 11/00* (2006.01)
*F16B 21/00* (2006.01)

(52) U.S. Cl.
USPC .................................. 29/525.11; 403/322.4

(58) Field of Classification Search
CPC .... H05K 7/1409; H05K 7/1411; B25B 27/28; B25H 3/028
USPC ........ 29/525.11, 426.1, 426.5, 428, 453, 468, 29/525; 361/798, 754, 801, 796; 312/218; 403/322.4, 321
See application file for complete search history.

(56) References Cited

U.S. PATENT DOCUMENTS 7,296,451 B2 * 11/2007 Dole .............................. 72/105

* cited by examiner

*Primary Examiner* — John C Hong
(74) *Attorney, Agent, or Firm* — Jenkins, Wilson, Taylor & Hunt, P.A.

(57) ABSTRACT

The invention is directed to a module injection mechanism and a method of using the same for mounting a module to a chassis, the module injection mechanism comprising an injection assembly secured to the module, comprising a lever, a screw affixed to the chassis, a sliding bushing, disposed between the module and the screw, wherein the screw is fixed to the chassis via the sliding bushing, the lever comprising a lever grabbing portion and a lower lever portion capable of connecting to the sliding bushing, wherein the injection assembly is secured to the module so that the injection assembly is capable to transfer a mechanical force applied to the lever grabbing portion to the sliding bushing so that the module is mounted to the chassis.

16 Claims, 5 Drawing Sheets

INJECTION MECHANISM FOR MODULES, AND METHOD OF USING THE SAME

FIELD OF THE INVENTION

The present invention relates generally to modules, such as fiber optic modules, and methods for their use. In particular, the present invention relates to mechanisms for injecting with ease detachable fiber optic modules into a chassis, and to a method of using the mechanisms of the invention for injecting the fiber optic module into the chassis.

BACKGROUND OF THE INVENTION

In complex electronics systems, for example a communications system such as a switch or a fiber optic module, various components can be provided as replaceable units that can be inserted into and removed from a chassis for maintenance. Such steps are often referred to as the injection and ejection of a replaceable unit, or the mounting and dismounting of a replaceable unit.

Especially in a large system that includes a significant number of electrical and/or mechanism connections, a considerable force may need to be applied to insert the replaceable units. It is desirable, therefore, to provide an injection mechanism that can enable a user readily to inject a replaceable unit in a manner that does not potentially cause harm or damage to the replaceable unit and allows the injection to be executed with ease.

SHORT SUMMARY OF THE INVENTION

The embodiments of the present invention seek at least to mitigate at least some of these concerns.

Various invention aspects are set out in the accompanying claims. Other invention aspects are described herein. The invention aspects have been made, at least in part, consideration of problems and drawbacks of conventional systems.

In accordance with one example embodiment of the present invention, a module injection mechanism, for mounting a module to a chassis is provided. This mechanism comprises an injection assembly secured to the module, comprising a lever, a screw affixed to the chassis, and a sliding bushing, disposed between the module and the screw, wherein the screw is fixed to the chassis via the sliding bushing, the lever comprising a lever grabbing portion and a lower lever portion capable of connecting to the sliding bushing, the injection assembly being secured to the module so that the injection assembly is capable to transfer a mechanical force applied to the lever grabbing portion to the sliding bushing so that the module is mounted to the chassis.

In the module injection mechanism of the present invention the screw may be a knurled screw and a thumb screw, and the screw comprises a head portion having an outer face, and a face capable to abut against a surface of the sliding bushing, and a shank portion having an unthreaded portion and a threaded portion. The lower lever portion abuts to the chassis, and comprises at least two pivot holes, each pivot hole being capable of receiving a pivot screw. At least one of the two pivot holes has an oval shape, and the pivot screw is capable of sliding in the pivot hole of oval shape. The lower lever portion of the lever is connected with the module via at least one pivot hole.

The module comprises a plurality of panels, and is provided with a threaded through hole in one panel that is a panel perpendicular to a direction of movement of the lever. The screw is capable to be attached to the module via the threaded through hole and via the sliding bushing. The sliding bushing comprises at least one through orifice, and at least one lateral orifice disposed on a lateral face of the sliding bushing. The screw is capable of being secured in the threaded through hole via a clip, and the threaded portion of the screw via the threaded through hole is capable of engaging the chassis.

The lower lever portion is capable of engaging the lateral orifice of the sliding bushing via one pivot screw passing via the oval pivot hole. The lower lever portion abuts to the chassis via a lever shoulder that is in direct mechanical contact with the chassis. The module is one of a fiber optics module, a communications switch, and a compact PCI module. The chassis has a plurality of lateral threaded orifices capable of receiving a threaded portion of the screw.

In accordance with another aspect of the present invention a method of mounting a module to a chassis, is disclosed. The method comprises affixing a screw to the chassis, fully screwing the screw into the chassis, disposing between the module to be mounted and the screw a sliding bushing, applying a force to a lever that is attached to the sliding bushing, the force being applied in a direction that coincides with a direction of module insertion, so that the sliding bushing abuts against a face the screw and so that the combination of the movement of the lever and the movement of the sliding bushing causes the module to be mounted to the chassis.

In accordance with the method the screw is affixed to the chassis via a sliding bushing, a threaded through hole, and a clip by rotating the screw in a threaded lateral orifice of the chassis and thereby engaging a threaded portion of the screw into the threaded lateral office of the chassis. The sliding bushing is capable of sliding along the unthreaded portion of the shank portion of the screw.

Although various aspects of the invention are set out in the accompanying independent and dependent claims, other aspects of the invention include any combination of features from the described embodiments and/or the accompanying dependent claims, possibly with the features of the independent claims, and not solely the combinations explicitly set out in the accompanying claims.

BRIEF DESCRIPTION OF THE DRAWINGS

Specific embodiments are described by way of example only with reference to the accompanying drawings in which.

Figure 1:
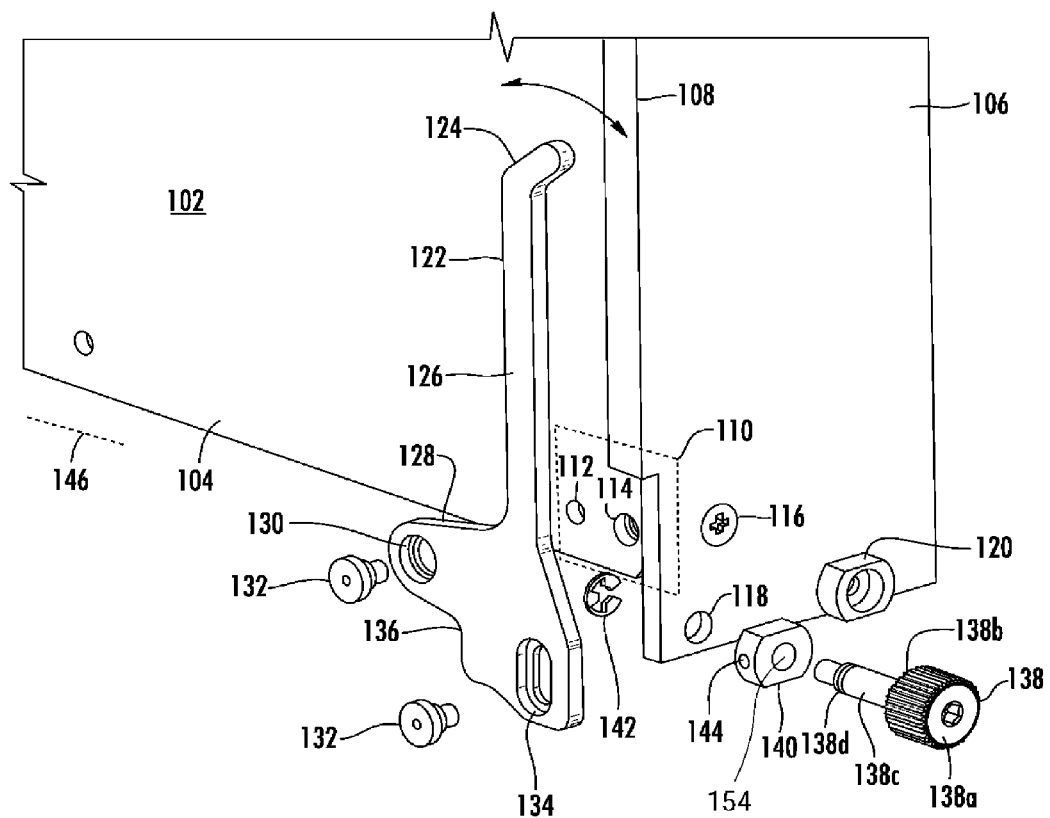
FIG. 1 is an exploded view of a module injection mechanism.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention.

DETAILED DESCRIPTION OF THE INVENTION

Although in the following the present invention will be discussed in connection with only one replaceable unit or module, the scope of the invention is not restricted to the embodiments described therein as having only one replaceable unit mountable on a chassis. The present invention is applicable especially to cases where multiple removable units are to be mounted on a chassis. The presentation in the following of cases that comprise only a unit on a chassis is only exemplary.

In accordance with the present invention chassis can include at least one location for receiving a replaceable unit, such as a module. The module may comprise at least one injection mechanism for mounting and dismounting the unit in/from the chassis. Each said location can include at least one chassis component for interacting with the injection mechanism. Such components of the chassis may exemplarily be a plurality of lateral threaded orifices in the chassis that accommodate a threaded portion of a screw that aims to secure a module to be mounted to the chassis.

In accordance with the present invention by module is understood, without limitation specifically to, a fiber optics module, a compact PCI, a switch modular component or any other rack mount device that is employed in the electronics, or communications industry.

Exemplarily a module may comprise a front side panel, that may be provided with a plurality of interfaces, that facilitate the performance of functionality of the module, a plurality of panels, such as a left side panel and a right side panel and a top/bottom panel, and a back panel, that comprises at least electrical and mechanical connections, that facilitate both the functionality of the module and the interconnectivity of the module with other module and with outside elements. The multiple module panels may be joined together via edges.

Referring now to FIG. 1, FIG. 1 is an exploded view of a module ejection/injection mechanism, in accordance with the present invention.

A movable module 102 is illustrated in FIG. 1 in a side view. The side view perspective affords the view of a left side panel 104 of the module 102 and a partial view of a front side panel 106 of the module 102. The two module panels 104 and 106 are disposed perpendicularly onto each other, united at an edge 108. Other side panels of the module 102 are not shown in this figure. It is further assumed that the module 102 is movable versus a fixed chassis 146 (not shown in detail in FIG. 1), chassis 146 that is customarily provided with small roles (not shown in FIG. 1) to facilitate the insertion of the module, or the extraction of the module 102, to the chassis.

The edge 108 facilitates the assembly of the left side panel 104 of the module 102 with the front side panel 106 and extends from a top panel of the module 102 (not shown in the figure) almost till the bottom of the module 102. The elevated portion 110 of the left side panel 104 shows a portion where the edge 108 is not present. It may be observed that the left side panel 104 of the module 102 is provided with one or more through threaded holes 112 and 114, that as it will described further in this document, facilitate the attachment to the left side panel 104 of the module 102 of a module injection/ejection mechanism.

The front side panel 106 of the module 102 comprises a plurality of screws 116 attaching the front side panel 106 to the module 102. Of course, the front side panel 106 of the module 102 may comprise various interfaces (not illustrated in the figure) that enable the performance of the specific functionality provided by the module 102.

The front side panel 106 comprises at least one through hole 118 and at least one threaded press-in insert 120 that has been used in the art to facilitate the attachment of the module 102 to the chassis 146. This press-in insert 120 has a threaded insert and is a standard feature provided on all modules. It is used in the art to facilitate mounting of modules on the chassis, or the press-in insert 120 is the customary solution for keeping in place a module 102 on the chassis 146, since the via a threaded press-insert 120 a screw can be introduced and screwed in an orifice of the chassis 146, especially provided at equal distances in the chassis 146 for this purpose.

Further illustrated in FIG. 1 is a lever 122 comprising, in accordance with an embodiment of the present invention, a lever grabbing portion 124, a lever elongated portion 126, and a lower lever portion 128 that engages with the chassis 146.

The lever grabbing portion 124 of the lever 122 is dimensioned so that a user may comfortably grab the lever 122 and is be able to exert a mechanical force onto the lever 122. The grabbing portion 124 of the lever 122 is illustrated as an inclined portion in FIG. 1 but it may have any other shape that facilitates a comfortable grip for the user. It is envisioned in accordance with the invention that upon grabbing portion 124 a user will attempt to move the lever 122 in a direction indicated by the arrows in FIG. 1.

The lever 122 further comprises an elongated portion 126 that is envisioned to be dimensioned in accordance with the present invention of varying length. The length of the lever elongated portion will depend upon the mechanical force expected to be exerted upon the lever 122 by a user. The lever 122 is envisioned to be manufactured of various materials that may withstand the applied forces onto the lever 122.

The lever 122 further comprises a lower lever portion 128 situated at the opposite end of the lever from the grabbing portion 124 of the lever 122. The portion 128 of the lever 122 has a particular shape that facilitates the engagement of the lever 122 with the chassis 146 and it is determined by the shape of the chassis 146, especially if the chassis 146 comprises obstacles that the lever 122 needs to clear/avoid. For example, the lower lever portion 128 may have a portion that is shaped like a step 136, denominated a lever shoulder 136. Any other shapes that facilitate the engagement of the lever 122 with the chassis 146 or the abutment of the lever 122 with the chassis 146 are considered to be comprised within the scope of the present invention.

The lower portion of the lever 128 is provided with at least two through pivot holes 130 and 134 via which at last two pivot screws 132 are introduced. The embodiment of the invention illustrated in FIG. 1 shows the portion 128 of the lever 122 having only two holes 130 and 134. Other embodiments of the invention comprising more than two holes are as well considered to be within the scope of the present invention. The same applies for the number of corresponding holes 114 that will be described further in this document.

The lower portion 128 of the lever 122 is brought in contact with the left side panel 104 of the module 102 via the pivot hole 130 and threaded hole 112 or 114 that receive a pivot screw 132. In the embodiment of the invention illustrated in FIG. 1 the pivot hole 130 is illustrated as a circular hole with a diameter that coincides with the diameter of the threaded hole 114. Other shapes, such as an oval shape for the pivot hole 130 are as well contemplated to be comprised within the scope of the invention.

The lever 122 has in its lower portion 128 at least one more orifice, that is shown in FIG. 1 as an oval pivot hole 134, in which another pivot screw 132 may be inserted. Said pivot screw 132 is inserted in the orifice 134 and connects the lever portion 128 with a sliding bushing via a lateral orifice in the sliding bushing 144.

The front side panel 106 of the module 102 is provided with screws 116 attaching the front side of the panel 106 to the module 102 and to the left side panel 104 of the module 102. Further, the front side panel 106 is already provided with molded threaded press-in inserts 120, as these inserts constitute a modality frequently employed in the art for attaching the module 102 to the chassis 146.

The front side panel 106 is provided further with at least one through threaded hole 118 that accepts a screw 138 that is insertable into the hole 118. Screw 138 is a crew that is both threaded and has a portion that permits the sliding of a bushing. Exemplarily the crew 138 is a knurled screw. The knurled screw 138 is insertable into the hole 118 via a sliding bushing 140. The sliding bushing 140 comprises an orifice 144. In accordance with the invention the sliding bushing may have various shapes, such as circular, semi-circular, etc. Irrespective of its shape, the sliding bushing 140 always comprises an orifice 144 disposed laterally on the bushing 140. The knurled screw 138 is secured in place in the threaded through hole 118 via a clip 142.

The lower portion of the lever 128 is in contact with the sliding bushing 140 via a pivot screw 132 that engages the oval pivot hole 134 and the orifice 144 of the sliding bushing 140. The oval shape of the pivot hole 134 facilitates that the pivot screw 132 executes a sliding motion within the oval pivot hole 134. When a user exerts a force upon the grabbing portion 124 of the lever 122 the force propagates via the elongated portion 126 of the lever 122 to the pivot screw 132 that slides within the oval pivot hole 143 causing a sliding at the same time of the sliding bushing 140 along the axis of the knurled screw 138. As a result, a sliding movement is created along the axis of the knurled screw 138 that coincides with the direction of injection or ejection of the module 102 in the chassis 146. As a result, a pressure is exerted upon the module 102 in the chassis 146 that leads to its insertion or its ejection into the chassis, as it will be described further in detail in the remaining portions of this document.

Therefore, in an exemplary embodiment of the present invention, as illustrated in FIG. 1, a module injection mechanism, for mounting a module 102 to a chassis 146, comprises an injection assembly secured to the module 102, comprising a lever 122, a screw 138 affixed to the chassis 146, a sliding bushing 140, disposed between the module 102 and the screw 138, the screw 138 being fixed to the chassis 146 via the sliding bushing 140. The lever 122 comprises at least a lever grabbing portion 124 and a lower lever portion 128 capable of connecting to the sliding bushing 140, the injection assembly being secured to the module 102 so that the injection assembly is capable to transfer a mechanical force applied to the lever grabbing portion 124 to the sliding bushing 140 so that the module 102 is mounted to the chassis 146.

The screw 138 may be any kind of screw that is capable of performing the functions described above an in exemplary embodiments of the invention is one of a knurled screw and a thumb screw. The screw 138 comprises a head portion having an outer face 138a, and a face 138b capable to abut against a surface of the sliding bushing 140, and a shank portion having an unthreaded portion 138c and a threaded portion 138d.

The lower lever portion 128 abuts to the chassis 146. The lower lever portion 128 comprises at least two pivot holes 130, 134, each pivot hole being capable of receiving a pivot screw 132. At least one pivot hole 130, 134 has an oval shape. The pivot screw 132 is capable of sliding in the pivot hole of oval shape 134. The lower lever portion 128 is connected with the module 102 via at least one of the two pivot holes 130, 134.

The module is formed by a plurality of panels 104, 106, 108, and is provided with a threaded through hole 118 in one panel of the plurality of panels that is a panel 106 perpendicular to a direction of movement of the lever 122.

The screw 138 is capable to be attached to the module 102 via the threaded through hole 118 and via the sliding bushing 140. The sliding bushing 140 comprises at least one through orifice 154, and at least one lateral orifice 144 disposed on a lateral face of the sliding bushing 140. The screw 138 is capable of being secured in the threaded through hole 118 via a clip 142, and the threaded portion of the screw 138d via said threaded through hole 118 is capable of engaging the chassis 146.

The lower lever portion 128 is capable of engaging the lateral orifice 144 of the sliding bushing 140 via one pivot screw 132 passing via the oval pivot hole 134. The lower lever portion 128 abuts to the chassis 146 via a lever shoulder 136 that is in direct mechanical contact with the chassis 146. The chassis 146 may have a plurality of lateral threaded orifices 148 capable of receiving a threaded portion 138d of the screw 138.

In order to insert a module to the chassis, the screw 138 is affixed to the chassis by fully screwing in the screw 138 into the chassis 146. As such the flat surface of the sliding bushing 140 abuts against the screw surface 138b. The lower portion of the lever 128 is attached to the sliding bushing 140. A force is exerted to the lever in a direction that coincides with the direction of insertion of the module to the chassis. This motion causes the sliding bushing 14o, that is now attached to the lever, to abut against the surface of the screw 138b. The combination of the movement of the lever 122 and the movement of the sliding bushing 140 is what causes the movement of the module 102 towards the chassis 146 and ultimately resulting into mounting the module onto the chassis 146.

Figure 2:
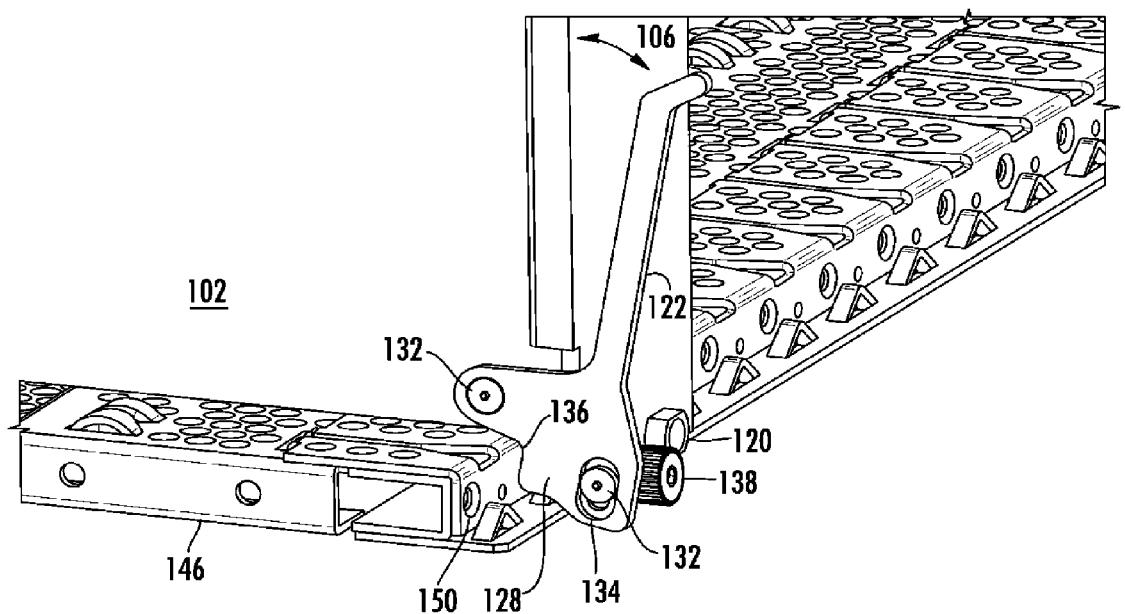
FIG. 2 is a perspective view of one embodiment of the module injection mechanism according to the present invention.
Figure 3:
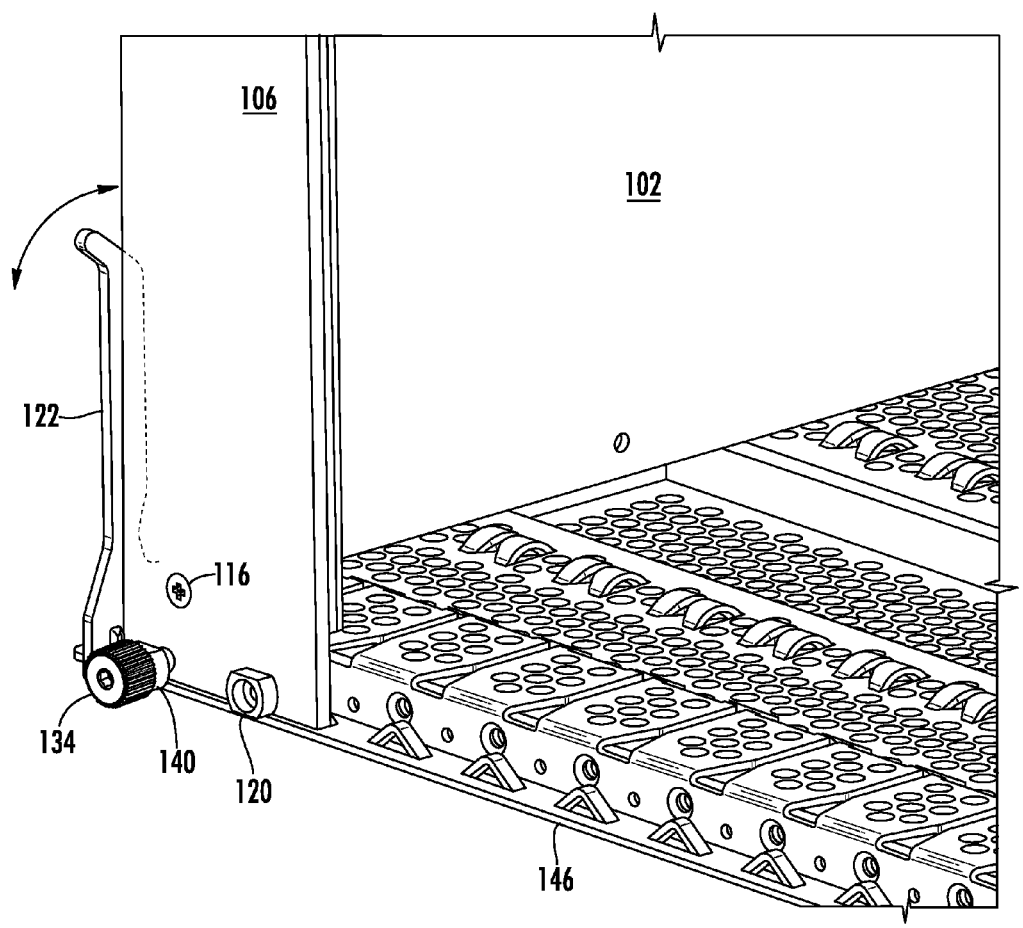
FIG. 3 is another perspective view of one embodiment of the module injection mechanism according to the present invention.

Referring now to the illustration of FIGS. 2 and 3, FIG. 2 is a perspective view of one embodiment of the module injection mechanism according to the present invention, and FIG. 3 is another perspective view of one embodiment of the module injection/ejection mechanism according to the present invention.

As it may be observed in the figures, of which FIG. 2 is a front view and FIG. 3 is a back view, a module 102 is installed on the chassis 146. Both the module 102 and the chassis 146 are typical and may be retrofitted to comprise the injection mechanism of the present invention. As it may be observed in both figures, the lever 122 may execute a movement along the direction indicated in the FIGS. 2 and 3 by the shown arrows.

Exemplarily, is sizes associated with the module to be inserted are 2×2 meters, it has been observed that the module injection mechanism may be conveniently sized as having approximately 70 cm total length and 2 cm in thickness. These dimensions are only exemplary and a whole range of other conveniently elected sizes is as well contemplated to fall under the scope o the present invention.

It may be further observed in the FIGS. 2 and 3 that the lever portion 128 that engages the chassis 146 is shaped in a convenient manner so that the lever 122 engages the chassis 146 but at the same time is capable of avoiding the ornamental or functional elements of the chassis 146.

Figure 4:
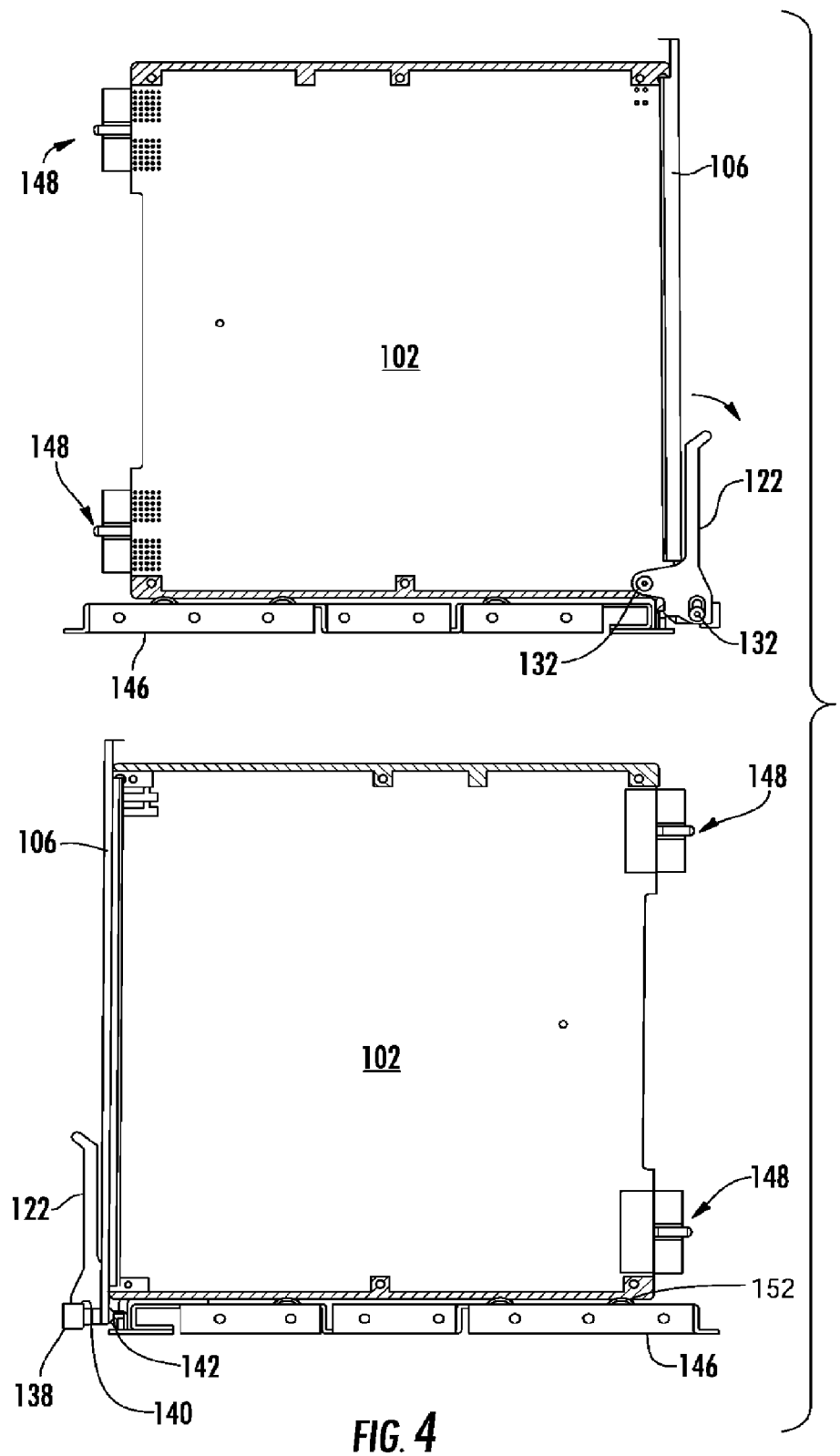
FIG. 4 is a view of a module injection mechanism employed for the ejection of a module.

Referring now to FIG. 4, FIG. 4 is yet another view of a module injection mechanism of the present invention, mechanism that at this time is shown to be employed for the ejection of a module 102. As explained in connection with the figure the mechanism of the present invention the mechanism put forth by the present invention may be as well employed for the ejection of a module from the chassis.

As it may be observed in FIG. 4 the module 102 comprises on a backplane a plurality of mechanical or electrical connectors 148. Especially large modules includes a significant number of electrical and/or mechanism connections, and as such a considerable force may need to be applied to insert and remove the module. It may be further observed that the module connects with the chassis 146 via a plurality of roles 152 that facilitate the insertion and removal of the module 102.

As it may be observed form the figure, a movable module 102 is mounted on a fixed chassis 146. An insert/eject lever 122 engages via a pivot screw 132 with the module 102 and via the pivot screw 132 and the oval pivot hole 134 with the sliding bushing 140—knurled screw 138 assembly. The screw 138 needs to be fully loosened for the ejection of the module to take place. The clip 142 holds the lever 122 and the assembly sliding bushing 140—knurled screw 138 together. In order to extract the module 102, the knurled screw 138 is fully loosened and the lever 122 is pulled outward in the direction of the arrow shown in FIG. 4. The lever profile 128 via its profile 136 abuts or engages with the chassis 146 to leverage the module 102 free from the backplane connectors 148 in the chassis 146. As such the module 102 is freed from the chassis 146 via a simple pull of the lever 122, as opposed to having to pull the module 102 out manually, that may require a large force and affords the opportunity to damage the module 102.

Figure 5:
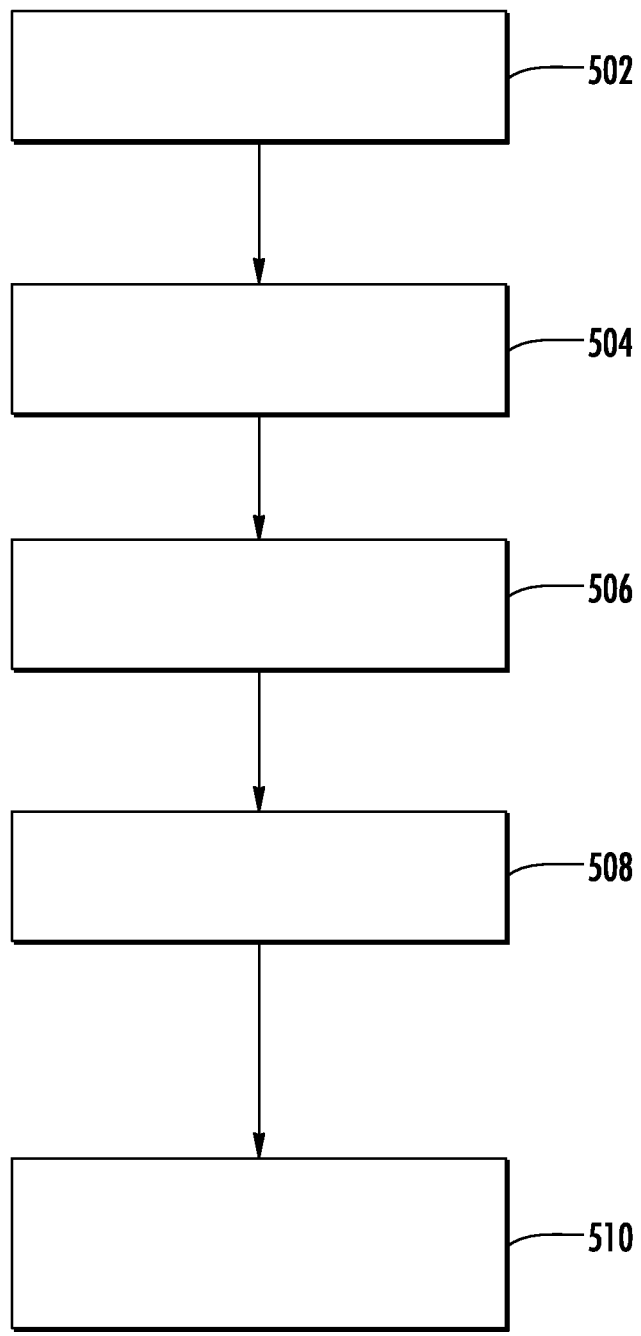
FIG. 5 is a flow chart illustrating the method of using the module injection mechanism of the present invention for mounting a module to a chassis.

Referring now to FIG. 5, FIG. 5 is a flow chart illustrating the method of using the module injection mechanism of the present invention for mounting a module 102 to a chassis.

In accordance with method 500 of the present invention, a module 102 may be mounted to a chassis by affixing, in a step 502, a screw 138 to the chassis 146, and subsequently fully screwing, in a step 504, the screw 138 into the chassis 146. In a subsequent step 506, between the module to be mounted 102 and the screw 138 is disposed a sliding bushing 140. A force is applied, in step 508 to a lever 122 that is attached to the sliding bushing 140, the force being applied in a direction that coincides with a direction of module insertion. As a result the sliding bushing 140 abuts, in a step 510, against a face 138b the screw 138 and the combination of the movement of the lever 122 and the movement of the sliding bushing 140 causes the module 102, to be mounted, in a step 612, to the chassis 146.

The screw 138 is affixed to the chassis 146 via the sliding bushing 140, a threaded through hole 118, and a clip 142 by rotating the screw 138 in a threaded lateral orifice 148 of the chassis 146 and thereby engaging a threaded portion 138d of the screw 138 into the threaded lateral office 148 of the chassis 146. The sliding bushing 140 is capable of sliding along the unthreaded portion 138c of the shank portion of the screw 138.

The method of the present invention eliminates the current pushing on module face plates, if a module 102 is to be inserted, and the pulling on face plate screws if the module 102 is to be extracted, both actions that may prove to be very difficult depending on the module size, width and number and quality of connector interfaces that the module has with the cassis backplane, that cause the need for high insertion and extraction forces. As such, a chassis such as the chassis 146 does not need to be redesigned, so existing customer systems will work with the new modules and also provide backwards compatibility.

Although the embodiments above have been described in considerable detail, numerous variations and modifications will become apparent to those skilled in the art once the above disclosure is fully appreciated.

LEGEND OF ELEMENTS

102—module;
104—module left side panel;
106—module front side panel;
108—module edge;
110—elevation view of a portion of the module left side panel;
112, 114—through threaded holes;
116—screw;
118—threaded through hole;
120—threaded press-in insert;
122—lever;
124—lever grabbing portion;
126—lever elongated portion;
128—lower lever portion, that engages the chassis;
130—pivot hole;
132—pivot screw;
134—oval pivot hole;
136—lever shoulder;
138—screw;
138a—outer face of the head portion of the screw;
138b—face of the head portion of the screw abutting against the sliding bushing;
138c—unthreaded portion of the screw;
138d—threaded portion of the screw;
140—sliding bushing;
142—clip;
144—lateral orifice in the sliding bushing;
146—chassis;
148—backplane mechanical/electrical connectors,
150—lateral threaded orifices in the chassis; and
152—roles.

What is claimed is:

1. A module injection mechanism, for mounting a module to a chassis, comprising:
    an injection assembly secured to the module, comprising:
        a lever,
        a screw affixed to the chassis,
        a sliding bushing, disposed between the module and the screw,
    wherein the screw is fixed to the chassis via the sliding bushing,
    the lever comprising:
        a lever grabbing portion and
        a lower lever portion capable of connecting to the sliding bushing,
    wherein the injection assembly is secured to the module so that the injection assembly is capable to transfer a mechanical force applied to the lever grabbing portion to the sliding bushing so that the module is mounted to the chassis.

2. The module injection mechanism of claim 1, wherein said screw is one of a knurled screw and a thumb screw, and wherein said screw comprises a head portion having an outer face, and a face capable to abut against a surface of said sliding bushing, and a shank portion having an unthreaded portion and a threaded portion.

3. The module injection mechanism of claim 1, wherein said lower lever portion abuts to the chassis, and wherein said lower lever portion comprises at least two pivot holes, wherein each of said at least two pivot holes is capable of receiving a pivot screw.

4. The module injection mechanism of claim 1, wherein at least one of said at least two pivot holes has an oval shape, and wherein said pivot screw is capable of sliding in said pivot hole of oval shape.

5. The module injection mechanism of claim 3, wherein the lower lever portion abuts to the chassis via a lever shoulder that is in direct mechanical contact with the chassis.

6. The module injection mechanism of claim 1, wherein said lower lever portion of said lever is connected with the module via at least one of said at least two pivot holes.

7. The module injection mechanism of claim 1, wherein the module comprises a plurality of panels, and wherein the module is provided with a threaded through hole in one panel of said plurality of panels that is a panel perpendicular to a direction of movement of the lever.

8. The module injection mechanism of claim 1, wherein the screw is capable to be attached to the module via said threaded through hole and via the sliding bushing.

9. The module injection mechanism of claim 8, wherein the screw is capable of being secured in said threaded through hole via a clip, and wherein the threaded portion of the screw via said threaded through hole is capable of engaging the chassis.

10. The module ejection mechanism of claim 1, wherein said sliding bushing comprises at least one through orifice, and at least one lateral orifice disposed on a lateral face of said sliding bushing.

11. The module injection mechanism of claim 10, wherein the lower lever portion is capable of engaging the lateral orifice of the sliding bushing via one pivot screw passing via said oval pivot hole.

12. The module injection mechanism of claim 1, wherein the module is one of a fiber optics module, a communications switch, and a compact personal computer interface (PCI) module.

13. The module injection mechanism of claim 1, wherein the chassis has a plurality of lateral threaded orifices capable of receiving a threaded portion of said screw.

14. A method of mounting a module to a chassis, comprising:
affixing a screw to the chassis;
fully screwing the screw into the chassis;
disposing between the module to be mounted and the screw a sliding bushing,
applying a force to a lever that is attached to the sliding bushing,
said force being applied in a direction that coincides with a direction of module insertion,
so that the sliding bushing abuts against a face the screw and
so that the combination of the movement of the lever and the movement of the sliding bushing causes the module to be mounted to the chassis.

15. The method of mounting a module to a chassis of claim 14, wherein the screw is affixed to the chassis via a sliding bushing, a threaded through hole, and a clip by rotating the screw in a threaded lateral orifice of the chassis and thereby engaging a threaded portion of the screw into the threaded lateral office of the chassis.

16. The method of mounting a module to a chassis of claim 14, wherein said sliding bushing is capable of sliding along the unthreaded portion of a shank portion of the screw.

\* \* \* \* \*